United States Patent [19]

Pichl

[11] Patent Number: 5,174,847
[45] Date of Patent: Dec. 29, 1992

[54] PROCESS FOR THE PRODUCTION OF A CIRCUIT ARRANGEMENT ON A SUPPORT FILM

[76] Inventor: Fritz Pichl, Seehalden Strasse 17, CH-8802 Kilchberg, Switzerland

[21] Appl. No.: 666,890

[22] Filed: Mar. 8, 1991

Related U.S. Application Data

[62] Division of Ser. No. 599,701, Oct. 18, 1990.

[30] Foreign Application Priority Data

Oct. 20, 1989 [CH] Switzerland ............... 3818/89

[51] Int. Cl.$^5$ ............................................ B32B 31/00
[52] U.S. Cl. ................................. 156/234; 156/233; 156/267; 156/269; 156/248
[58] Field of Search .............. 156/152, 233, 234, 267, 156/269, 247, 248, 264; 29/848

[56] References Cited

U.S. PATENT DOCUMENTS

| | | | |
|---|---|---|---|
| 2,776,235 | 1/1957 | Peck | 156/234 |
| 2,969,300 | 1/1961 | Franz | 156/233 |
| 3,301,730 | 1/1967 | Spiwak et al. | 156/267 |
| 3,585,093 | 6/1971 | Britt | 156/234 |
| 3,678,577 | 7/1975 | Weglin et al. | 29/848 |
| 4,717,438 | 1/1988 | Benge et al. | 156/152 |
| 4,818,312 | 4/1989 | Benge | 156/269 |
| 4,859,263 | 8/1989 | Dziurla et al. | 156/234 |
| 4,914,079 | 4/1990 | Takei et al. | 156/234 |

Primary Examiner—David A. Simmons
Assistant Examiner—James J. Engel, Jr.
Attorney, Agent, or Firm—Ostrolenk, Faber, Gerb & Soffen

[57] ABSTRACT

The circuit arrangement has at least one electrically conductive cut conductor track on at least one surface of a support film, the support film being free of deformations and fluctuations in the thickness, both in the region of the conductor track covering it and outside this region. The edges of the conductor track have a projection in the form of a stamping burr. A negative circuit is applied to a stamping substrate or embossed in the latter by means of embossing dies or punching tools constituting a block; the conductor track representing the remaining positive circuit is transferred to the support film.

19 Claims, 1 Drawing Sheet

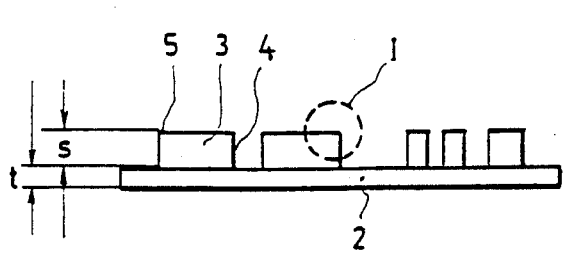
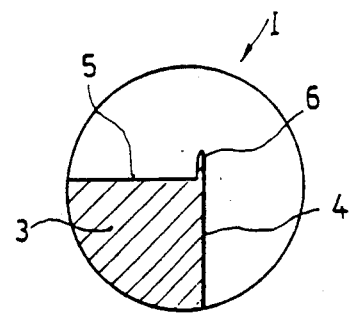
Fig.1  Fig.1a
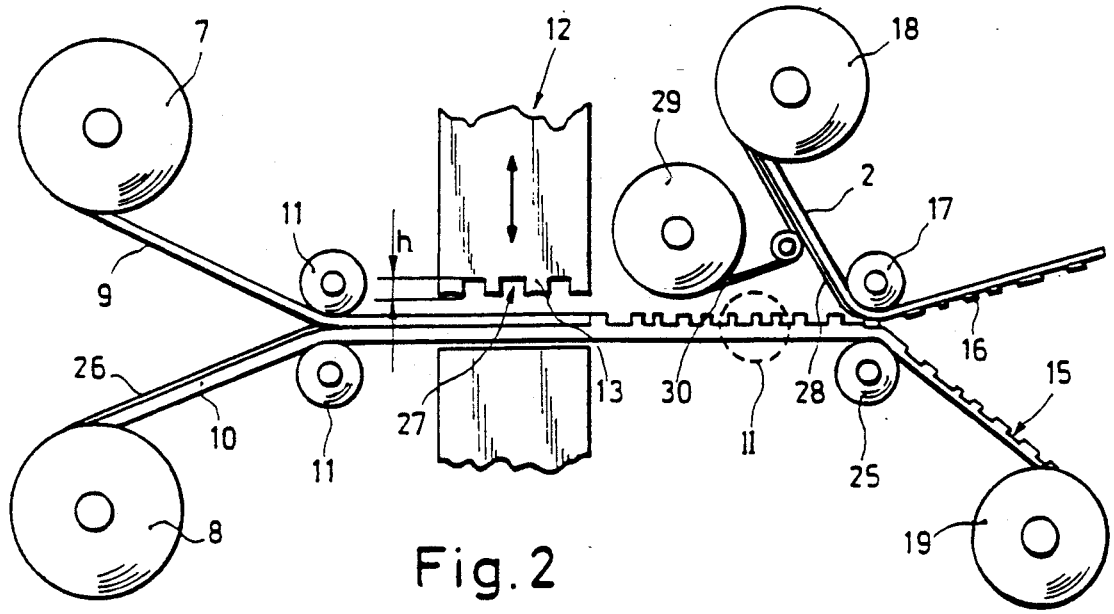
Fig.2
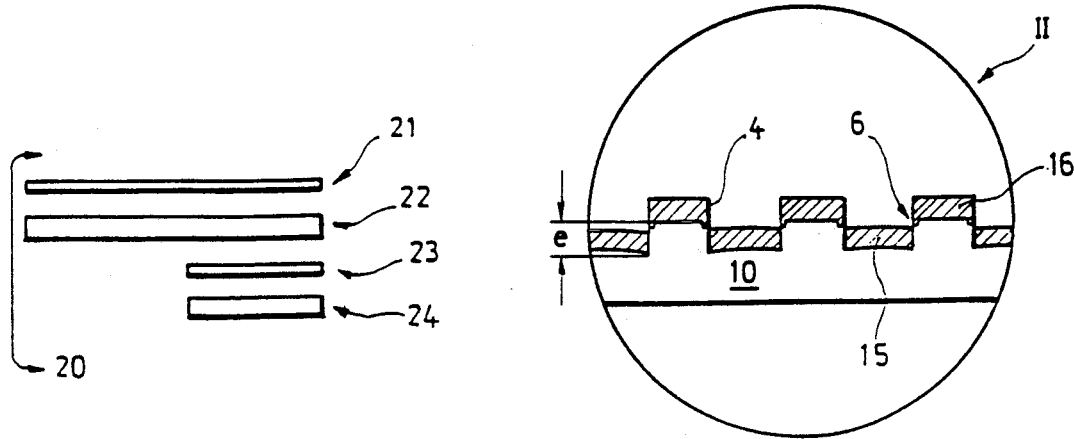
Fig.3  Fig.2a

PROCESS FOR THE PRODUCTION OF A CIRCUIT ARRANGEMENT ON A SUPPORT FILM

This is a division of application Ser. No. 07/599,701, filed Oct. 18, 1990.

FIELD OF THE INVENTION

The invention relates to a process for the production of a circuit arrangement in union at least one electrically conductive track is arranged on at least one surface of a support film by means of an adhesive layer.

BACKGROUND ART

Such circuit arrangements are used for a very wide range of purposes, for example including resonance labels. Such resonance labels, which are used in particular for goods security, for example in department stores, should for obvious reasons be capable of being attached to all possible goods as simply as possible and should therefore be as flat and flexible as possible without their characteristic electrical properties suffering as a result. Attempts have therefore been made to mount the conductor tracks on as thin a layer as possible, which serves both as a support substrate and as an insulating substrate. The conductor tracks are etched in a known manner from a conductive foil or stamped onto the support substrate.

Photo etching techniques, including the screen printing techniques also used in some cases, are relatively expensive, especially because of the complexity of the production process, and are unacceptable from the ecological point of view, since etch sludge is obtained as a non-reusable disposable product. A possible alternative is to stamp conductor tracks onto a support substrate. Thus, U.S. Pat. No. 3,678,577 describes a process in which the conductor tracks are stamped onto a support substrate, very specific properties being required for the substrate materials used.

In a conventional process corresponding to the hot-stamping technique (mentioned in EP-B1-0063347), conductor tracks are applied to a plastic substrate. A conductor foil is applied, together with a support film, to a substrate and is pressed onto the substrate by means of heated die, only the conductor tracks being sheared off and at the same time bonded to the substrate. The support film remains intact and is used for peeling off those parts of the conductor foil which have not been stamped. It is evident that, when the conductor track is stamped into the substrate, this support film must on no account be sheared off also, since otherwise either the support film alone or non-stamped conductor track paths or both will be incompletely removed. Since, in this process, the conductor tracks are slightly embedded in the surface of the substrate, this requirement can be met only by very special support film materials. Furthermore, the substrate must be at least twice as thick as the conductor layer itself, particularly when a further conductor track arrangement is to be provided on the back of the substrate.

In the process described in EP-A1-292827 for the production of a label carrying an oscillating circuit, the conductor tracks are stamped from the conductor foil in two steps. In a first step, a middle track region is stamped out and is covered with an insulating tape. The outer track regions, which accordingly are not covered are stamped out in a second step. This laminate of stamped and partially covered conductor tracks is then mounted on a top film for stabilization. The problem here is the double stamping process, which must be controlled very precisely to ensure that there are no discontinuities in the completely stamped conductor tracks. Covering of the middle track region must also be carried out just as correctly. On the one hand, the insulating tape should not also be stamped but on the other hand, for stabilization, should cover the entire middle conductor tape which has already been stamped out.

DE-A1-3732825 also describes a process in which conductor tracks are stamped from a conductor foil, wherein one part of the stamped foil is pressed onto an adhesive web provided with a mask and the other part of the stamped foil is lifted off from another adhesive web provided with a mask. This process is suitable in particular for simple, complementary circuit patterns, but the masking operations tend to be disadvantageous since the masking must correspond exactly to the conductor track pattern and must do so with very highly defined positive tolerance in order to allow the stamped conductor track to be lifted off satisfactorily. This means, in particular, that multiply wound conductor coils will have a certain minimum width.

In the production of circuit arrangements by the known processes in which conductor tracks are applied to a support film, for example by hot-stamping or stamping, the cross-section of the support film is at least partially changed, there being either a reduction in the thickness due to the stamping in or embossing of the conductor tracks or as a result of the application of additional layers, for example marking agents, the conductor tracks or distortion or warping of the support film in the regions adjacent to the applied conductor tracks.

SUMMARY OF THE INVENTION

In the process according to the invention, having the features described in herein all these disadvantages are avoided.

Advantageous embodiments of the invention are described and claimed herein.

Since the desired conductor track is stamped from a foil of conductive material, it is referred to below as "metal foil", and this so-called positive circuit is applied to the desired support film. Any type of substrate is possible provided that it can be rendered capable of forming an adhesive bond. Thus, the support film can also have a substantially smaller thickness than the conductor track applied thereon. Since the stamping substrate which holds the negative circuit is unimportant for the end product, it need meet no requirements other than it be cheap and compressible under the particular stamping pressure.

If the hot-seal coat which assists the pressing of the negative circuit into the stamping substrate is applied in screen form to the stamping substrate or to the metal foil, this will be sufficient, in combination with the stamping into the stamping substrate, to fix the negative circuit. The positive circuit which represents the desired conductor track and is also subjected at the edges to the contact pressure of the stamp would then, however, be subjected to the adhesive action of this heat-sealed coat only at certain spots. To transfer this conductor track to a support film provided, the latter need then only be provided with an adhesive layer whose adhesive strength is greater than the adhesive strength between the conductor track and the stamping substrate.

The freedom from fluctuations in deformation and in thickness should be regarded relative to the fluctuations in deformation and thickness in the case of conventional circuit arrangements and as a rule is in an order of magnitude smaller than in the latter case.

BRIEF DESCRIPTION OF THE DRAWINGS

An embodiment of the invention is described below by way of example with reference to the drawings, wherein FIG. 1 shows a circuit arrangement according to an embodiment of the invention, on a support film, FIG. 1a shows the detail I from FIG. 1, FIG. 2 shows a schematic representation of the process for the production of a circuit arrangement corresponding to FIG. 1, FIG. 2a shows the detail II from FIG. 2 and FIG. 3 shows a resonance label produced by the process according to the invention.

DETAILED DESCRIPTION

The conductor tracks 3 which in their totality represent the circuit are located on a support film 2 (FIG. 1). They have been cut out of a foil of conductive material, in general aluminum or copper. The thickness s of this metal foil and hence that of the conductor tracks 3 is, for example for resonance labels, 50 to 60 $\mu$m. The film 2 which carries the conductor tracks 3 and, depending on the intended use, may be a plastic film, for example coated with a heat-sealing coat, or an adhesive layer or a varnish layer alone, then has a thickness t of only 15 to 20 $\mu$m. FIG. 1a shows the detail I from FIG. 1, where the embodiment of the conductor tracks 3 is shown on a magnified scale. Since punching tools of a punching press are used for cutting out the conductor tracks 3 from the metal foil, as described in more detail below, with reference to the process for the production of the circuit arrangement according to the invention, a projection, the so-called stamping burr 6, is formed at the edge between the cut borders 4 of the conductor tracks 3 and their surface 5.

FIG. 2 shows, in a schematic manner, the process for the production of a circuit arrangement 1 according to the invention. Metal foil 9 and stamping substrate 10 are brought into contact with one another in the form of tapes by means of rolls 7 and 8, respectively, via guide rolls 11, and are passed through a punch 12, the forward movement taking place stepwise in accordance with the operating cycle of the punch 12 and the register of the desired circuit arrangement.

The stamping substrate 10 is coated with a heat-sealing coat 26 on its side facing the metal foil 9; it may consist of a very wide range of very economical materials, such as, for example, cheap packaging paper. It is also possible for the metal foil 9 to be coated with the heat-sealing coat (not shown). The punching tools 13 of the punch 12 are then pressed onto metal foil 9 and stamping substrate 10. The projecting punching tools 13, which have been heated to a temperature of about 120 to 160° C, if necessary up to 250° C., have an approximately concave cross-section. The metal foil 9 can be coated with an antifriction coat on its side facing the punching 13, in order thus to promote the cutting process. The metal foil 9 is cut through and is pressed into the stamping substrate 10 at the points determined by the shape of the punching tools 13 As a result of the heating, the heat-sealing coat is activated; the cut parts of the metal foil 9 which have been pressed into the stamping substrate 10 are thus firmly bonded to the stamping substrate 10. The tool height h, i.e. the internal height of the voids 27 formed by the punching tools 13, should be chosen so that it is greater than a value defined by the sum of the thickness s of the metal foil 9 and the indentation depth e (FIG. 2a) determined by the compressibility of the stamping substrate 10. Only then is it ensured that the parts 16 which are located between the cut, pressed-in metal foil parts 15 forming the negative circuit and which represent the positive circuit and hence finally the conductor tracks 3 are satisfactorily separated from the metal foil parts 15 and do not adhere firmly to the stamping substrate 10. The positive circuit 16 is subjected to a certain contact pressure only at the cut borders 4 and is thus also heated. Thus, it will adhere only in these border regions to the stamping substrate 10 coated with heat-sealing coat but will only make light contact in the other regions However, since this heat-sealing coat is applied, for example, in the form of a screen to the stamping substrate 10 or to the metal foil 9, the positive circuit 16 will adhere to the stamping substrate 10 only at certain spots, which is sufficient to hold it firmly to the stamping substrate 10 for the further process steps. The transfer process is also simplified.

Then a stamping burr 6 formed during the stamping process can also be seen in FIG. 2a.

The support film 2 supplied via a roll 18 is pressed, by means of guide rolls 17 and 25, onto the stamping substrate 10 having the firmly pressed-in parts 15 of the metal foil and the positive circuit 16 on top. FIG. 2 shows, only schematically, the stamping substrate 10 carrying the positive circuit 16 and having the pressed-in negative circuit 15. FIG. 2a therefore shows a detail of this arrangement on a larger scale. This support film 2 is coated with an adhesive layer 28, which may be, for example, a pressure-activatable adhesive. If a heat-sealing coat is used, the roll 17 guiding the support film 2a is preferably heated and activates the adhesive. Thus, the positive circuit 16, which adheres relatively weakly (because it does so only in certain border regions) to the stamping substrate 10, is lifted off the latter and transferred to the support film 2. A condition for this is that the adhesive force of the adhesive with which the support film 2 is coated is greater than that of the adhesive with which the stamping substrate 10 or the metal foil 9 is coated. Since the metal foil parts 15 which constitute the negative circuit are embedded in the stamping substrate 10, they cannot also be transferred to the support film 2 in this process. The stamping substrate 10 having the pressed-in negative circuit 15 can be fed via a roll 19 of a means for recovering the pressed-in metal foil parts.

If the support film 2 is self-adhesive, it can be mounted on the roll 18, advantageously with release paper 30, which is then removed when the support film 2 is unrolled by means of a roll 29.

The support film 2 holding the positive circuit 16 can therefore be chosen completely at will, this applying both to its thickness and to its material, provided that the support film 2 can be rendered capable of adhesion. During the transfer process, it remains essentially flat and is not pressed, bent, warped or distorted, not even partially.

Instead of the stamping process described above, an analogous embossing process may be provided. In this case, instead of the punching tools, heatable embossing dies then constitute the block for the conductor tracks. Punching tools or embossing dies may preferably also be arranged on cylinders; in this case, the stamping process and the embossing process take place in rotation.

FIG. 3 shows schematically the individual layers from which a resonance label 20 produced by the process according to the invention is composed. For this purpose, at least one conductor coil and at least one capacitor plate should be provided in a layer 22 and at least one second capacitor plate in a layer 24, a dielectric layer 23 being present between these two conducting layers 22 and 24. The induction coil and capacitor together define the oscillating circuit. The special form produced by the shape of the punching tool together with the dielectric layer 23, determines the electrical properties of the resonance label 20. The layer 21 is, for example, printable paper, with which any labels are provided. For reasons of deactivation, the dielectric layer 23 should be made as thin as possible in order to allow the energy required for reliable deactivation to be kept as small as possible. If, however, a resonance label 20 is produced by the process according to the invention, one or both conducting layers 22, 24 can be transferred to the dielectric layer 23 in the manner described above, and this dielectric layer 23 may then preferably be in the form of an adhesive or varnish layer, for example covered on both sides with release paper and provided on a roll, which adhesive or varnish layer lifts the particular conductor tracks from correspondingly embossed stamping substrates in succession on its two sides.

However, a layer 21 intended for covering, or for providing text on, the resonance label 20 may be used in an analogous manner as a support film, which may be, for example, paper or plastic, for a conducting layer 22 or 24. The structure of the resonance label 20 then corresponds to the two circuit arrangements according to the invention, connected to one another.

I claim:

1. A process for placing a conductive foil having a predetermined shape on a support film, comprising the steps of:
   locating a conductive foil adjacent to a stamping substrate;
   stamping the conductive foil so as to separate a negative portion of said conductive foil from a remaining positive portion having said predetermined shape, and to embed said negative portion in said stamping substrate while partially compressing said stamping substrate beneath said negative portion; and then
   transferring said positive portion to said support film.

2. A process as in claim 1, wherein the stamping substrate is provided with an adhesive before said stamping step.

3. A process as in claim 2, wherein said adhesive is a heat-sealing coat.

4. A process as in claim 1, wherein the support film is provided with an adhesive before said transferring step.

5. A circuit arrangement as claimed in claim 4, wherein the support film is made exclusively of an adhesive material.

6. A circuit arrangement as claimed in claim 5, wherein the support film is made exclusively of a layer of varnish.

7. A process as in claim 1, wherein the stamping step creates burrs at edges of the negative foil portion which grip the compressed stamping substrate.

8. A process as in claim 1, wherein said stamping step adheres said positive foil portion substantially only at its edges to said stamping substrate.

9. A process as in claim 8, wherein the stamping substrate and the support film are provided with respective first and second adhesive layers; and an adhesive force exerted on the positive portion by the second adhesive layer is greater than an adhesive force exerted on the positive portion by the first adhesive layer and by the stamping substrate, thereby permitting said positive portion to be transferred from said first adhesive layer to said second adhesive layer.

10. A process as in claim 8, wherein the support film is provided with an adhesive, and an adhesive force exerted on the positive foil portion by the adhesive layer is greater than an adhesive force exerted on the positive foil portion by the stamping substrate, thereby permitting the positive foil portion to be transferred from said stamping substrate to said support film.

11. A process as in claim 1, wherein the stamping step includes the step of providing a punch having at least one tool which projects by an internal height (h) away from said punch and toward said foil, and has a stamping face corresponding to said negative foil portion to be separated from said foil; said internal height (h) being greater than the sum of the thickness (s) of the foil and the depth (e) of penetration of the tool into the stamping substrate.

12. A process as in claim 11, wherein said tool is heated and said stamping substrate is provided with a heat-sealing coat for adhering said negative foil portion to said stamping substrate.

13. A process as in claim 11, wherein said tool has a concave surface facing the foil.

14. A process as in claim 1, wherein said positive foil portion is applied to the support film by at least one guide roll.

15. A process as in claim 14, wherein said guide roll is heated and said support film is provided with a heat-sealing adhesive.

16. A process as in claim 15, wherein said support film has at least one receiving surface substantially completely covered with said heat-sealing adhesive.

17. A process as in claim 1, wherein the thickness (s) of the positive foil portion is substantially 20–70 $\mu$m and the thickness of the support film is substantially 5–60 $\mu$m.

18. A process as in claim 17, wherein the thickness (s) of the positive foil portion is substantially 40–60 $\mu$m and the thickness of the support film is substantially 5–40 $\mu$m.

19. A process as in claim 17, wherein the thickness of the support film is substantially 5–12.6 $\mu$m.

* * * * *